(12) United States Patent
Prodanov

(10) Patent No.: US 6,211,717 B1
(45) Date of Patent: Apr. 3, 2001

(54) MULTIPLE DIFFERENTIAL PAIR TRANSISTOR ARCHITECTURE HAVING TRANSCONDUCTANCE PROPORTIONAL TO BIAS CURRENT FOR ANY TRANSISTOR TECHNOLOGY

(75) Inventor: Vladimir I. Prodanov, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/322,961

(22) Filed: May 28, 1999

(51) Int. Cl.[7] .................................................. H03G 11/08
(52) U.S. Cl. ........................ 327/352; 327/359; 327/361
(58) Field of Search ..................................... 327/350, 352, 327/359, 361, 560, 346, 355

(56) References Cited

U.S. PATENT DOCUMENTS

| | | | |
|---|---|---|---|
| 5,319,264 | * 6/1994 | Kimura | 327/352 |
| 5,602,504 | * 2/1997 | Liu | 327/359 |

OTHER PUBLICATIONS

B. Gilbert, "The Multi–Tanh Principle: A Tutorial Overview," IEEE J. of Solid–State Circuits, vol. 33, 2–17 (Jan. 1998).

K. Lasanen et al., "A Structure for Extending the Linear Input Voltage Range of a Differential Input Stage," Proc. Int'l Conf. of Electronics, Circuits, and Systems, vol. 2, 355–58 (1998).

P. van Lieshout and R. van de Plassche, "A Power–Efficient, Low–Distortion Variable Gain Amplifer Consisting of Coupled Differential Pairs," IEEE J. of Solid–State Circuits, vol. 32, No. 12, 2105–2110 (1997).

* cited by examiner

Primary Examiner—Toan Tran
(74) Attorney, Agent, or Firm—Ryan, Mason & Lewis, LLP

(57) ABSTRACT

A multiple differential pair circuit is disclosed having a transconductance, $g_m$, proportional to the bias current, $I_0$, for any transistor technology. The transistors utilized to construct each of the differential transistor pairs in a multiple differential pair circuit operate in a non-exponential voltage-current (V-I) region. As multiple differential pair circuits are linearized, the effective transconductance, $g_m$, becomes (i) linearly dependent on bias current, and (ii) insensitive to the voltage-current (V-I) characteristics of the utilized devices. Methods and apparatus are disclosed that provide a linear transconductance, $g_m$, with respect to the bias current, $I_0$, using differential pairs of transistors where each transistor operates in a non-exponential voltage-current (V-I) region, such as MOS transistors.

14 Claims, 4 Drawing Sheets

300

400

500

INDIVIDUAL GM FUNCTION

600

MULTIPLE DIFFERENTIAL PAIR TRANSISTOR ARCHITECTURE HAVING TRANSCONDUCTANCE PROPORTIONAL TO BIAS CURRENT FOR ANY TRANSISTOR TECHNOLOGY

FIELD OF THE INVENTION

The present invention relates to multiple differential transistor pair circuits, and more particularly, to linear multiple differential transistor pair circuits.

BACKGROUND OF THE INVENTION

Multiple differential pair circuits consist of N differential pairs of transistors operating in parallel, each having an appropriate input offset voltage. Multiple differential pair circuits are well-known and have many applications, including amplifiers, mixers, filters and other active elements. For a detailed discussion of conventional multiple differential pair circuits implemented in bipolar technology and their applications, see, for example, B. Gilbert, "The Multi-Tanh Principle: A Tutorial Overview," IEEE J. of Solid-State Circuits, Vol. 33, 2–17 (January 1998), incorporated by reference herein.

FIG. 1 illustrates a conventional multiple differential pair circuit 100. The illustrative multiple differential pair circuit 100 consists of five (5) differential pairs of transistors 200-1 through 200-5 coupled in parallel. A representative differential transistor pair circuit 200 is discussed below in conjunction with FIG. 2. Four (4) of the five (5) differential transistor pair circuits 200-1, 200-2, 200-4, 200-5, each have a corresponding well-defined offset voltage $\Delta$-1, $\Delta$-2, $\Delta$-3, $\Delta$-4, shown in FIG. 1. Thus, the differential transistor pair circuit 200-3 in the middle of the multiple differential pair circuit 100 does not have an offset voltage, while the other differential transistor pair circuits 200-1, 200-2, 200-4, 200-5 have a corresponding offset, $\Delta$. As the differential transistor pair circuits 200-N progress away from the center differential transistor pair circuit 200-3, the offset voltage, $\Delta$, increases progressively, taking values of $\pm\Delta$, $\pm 2\Delta$ and so on, in a known manner. When configured in this manner, such circuits are referred to as equidistant-offset multiple differential pair circuits.

FIG. 2 is a schematic block diagram of a representative differential transistor pair circuit 200. The two transistor devices 210-1 and 210-2 that comprise the differential transistor pair circuit 200 are identical (i.e., perfectly matched), in a known manner. For a given applied voltage, $V_{IN}$, a desired output current, $I_1$, $I_2$, can be obtained from the differential transistor pair circuit 200 by varying the bias current, $I_O$.

Bipolar transistors, and thus, bipolar differential transistor pair circuits 200, have well-defined voltage-current (V-I) characteristics. Differential transistor pair circuits 200 have been implemented using bipolar transistors (or CMOS transistors operating in sub-threshold ranges where they behave like bipolar transistors), where the voltage-current (V-I) characteristic is exponential. FIG. 3 illustrates the voltage-current (V-I) characteristic 300 of the differential transistor pair circuit 200, shown in FIG. 2. Transistors having exponential voltage-current (V-I) characteristics were thought to be required in order to obtain multiple differential pair circuits 100 having a transconductance, $g_m$, that is linearly proportional to the bias current.

As apparent from the above-described deficiencies with conventional multiple differential pair circuits, a need exists for multiple differential pair circuits comprised of pairs of transistors having non-exponential voltage-current (V-I) characteristics. A further need exists for a multiple differential pair circuit that provides both linearity and linear tuning capabilities, independent of the transistor technology.

SUMMARY OF THE INVENTION

Generally, a multiple differential pair circuit is disclosed having a transconductance, $g_m$, proportional to the bias current, $I_O$, for any transistor technology. According to one aspect of the invention, the transistors utilized to construct each of the differential transistor pairs in a multiple differential pair circuit are permitted to have a non-exponential voltage-current (V-I) characteristic. In one implementation, the transistors are embodied as MOS transistors. The present invention thus allows multiple differential pair circuits with transconductance, $g_m$, proportional to bias current to be fabricated in any transistor technology.

As multiple differential pair circuits are linearized, the effective transconductance, $g_m$, becomes (i) linearly dependent on bias current, and (ii) insensitive to the voltage-current (V-I) characteristics of the utilized devices. Thus, the present invention recognizes that multiple differential pair circuit having a transconductance, $g_m$, that is linearly dependent on bias current can be fabricated using any transistor technology. Thus, transistors having an exponential voltage-current (V-I) characteristic are not required. In this manner, the present invention allows multiple differential pair circuits to be migrated from one technology to another without significantly impacting the operation of such multiple differential pair circuits.

Methods and apparatus are disclosed that provide a linear transconductance, $g_m$, with respect to the bias current, $I_O$, using differential pairs of transistors where each transistor has a non-exponential voltage-current (V-I) characteristic.

A more complete understanding of the present invention, as well as further features and advantages of the present invention, will be obtained by reference to the following detailed description and drawings.

DETAILED DESCRIPTION

Figure 1:
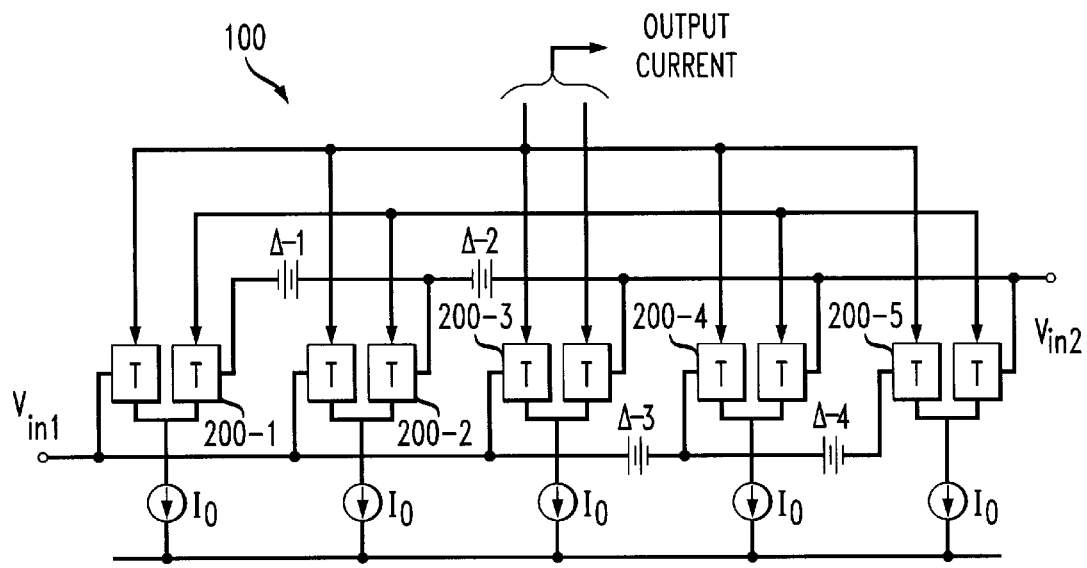
FIG. 1 illustrates a conventional multiple differential pair circuit.
Figure 2:
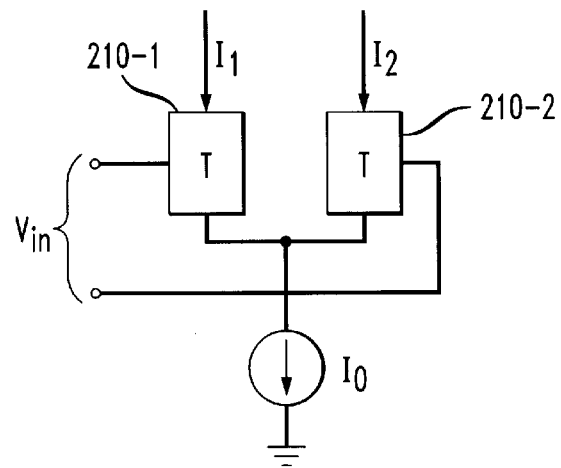
FIG. 2 is a schematic block diagram of a representative differential transistor pair circuit of FIG. 1.

The multiple differential pair circuits of the present invention may be constructed in the same manner as the conventional multiple differential pair circuit 100 shown in FIG. 1, as modified herein to provide the features and functions of the present invention. According to a feature of the present invention, the transistors 210-1, 210-2 in each of the differential transistor pair circuits 200-N have a non-exponential voltage-current (V-I) characteristic, such as MOS transistors. In this manner, the multiple differential pair circuits 100 of the present invention can be fabricated without regard to the transistor technology.

Figure 4:
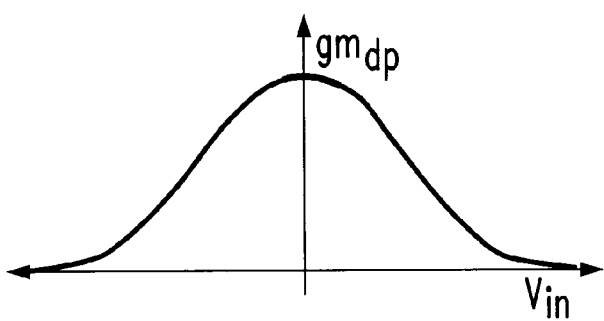
FIG. 4 illustrates the transconductance characteristic, $g_m$, of the differential transistor pair circuit of FIG. 2.

Multiple differential pair circuits 100 have a transconductance, $g_m$, that is proportional to the bias current. Again, such linear tunability was previously thought to be obtainable only from bipolar or bipolar-like (i.e., having an exponential voltage-current (V-I) characteristic) transistor technologies. The transconductance characteristic, $g_m$, 400 of the differential transistor pair circuit 200 is shown in FIG. 4. Generally, the transconductance, $g_m$, is the ratio of the incremental change in the output current, $I_1$, $I_2$, of the differential transistor pair circuit 200 to the incremental change in the input voltage, $V_{IN}$, when the bias current, $I_0$, is kept constant.

When the two transistors 210-1, 210-2 in each differential transistor pair circuit 200, the incremental transconductance, $g_m$, of the differential transistor pair circuit 200 can be expressed as follows:

$$gm_{dp}(V_{in}) = \left|\frac{\partial I_1}{\partial V_{in}}\right| = \left|\frac{\partial I_2}{\partial V_{in}}\right| \quad \text{Eq.(1)}$$

As shown in FIG. 4, the transconductance characteristic, $g_m$, 400 is a symmetric function of $V_{in}$. The shape of the transconductance characteristic, $g_m$, 400 strongly depends on the voltage-current (V-I) characteristic of the transistors 210-1, 210-2 in each differential transistor pair circuit 200. The present invention recognizes, however, that the area under the transconductance characteristic, $g_m$, 400 is completely independent of the device characteristics. The area under the transconductance characteristic, $g_m$, 400 equals the absolute change of the output current, $I_1$, $I_2$.

Figure 3:
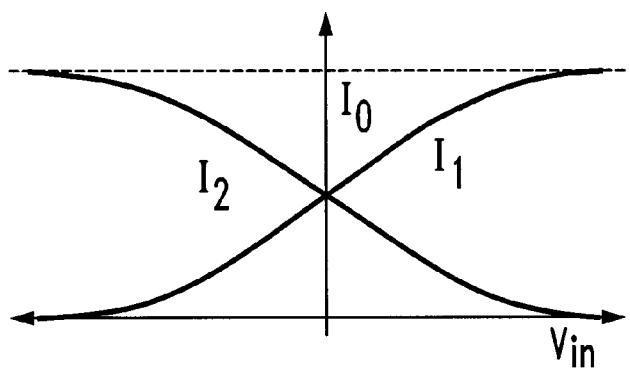
FIG. 3 illustrates the voltage-current (V-I) characteristic of the differential transistor pair circuit of FIG. 2.

As shown in FIG. 3, the absolute change of the output current, $I_1$, $I_2$, is equal to the bias or tail current, $I_0$. Thus, the following expression holds:

$$\int_{-\infty}^{\infty} gm_{dp}(x)dx = I_0 \quad \text{Eq. 2}$$

The symmetry of the transconductance characteristic, $g_m$, 400 and the constancy of the area under the transconductance characteristic, $g_m$, 400 are the two properties exploited by the present invention.

Figure 5:
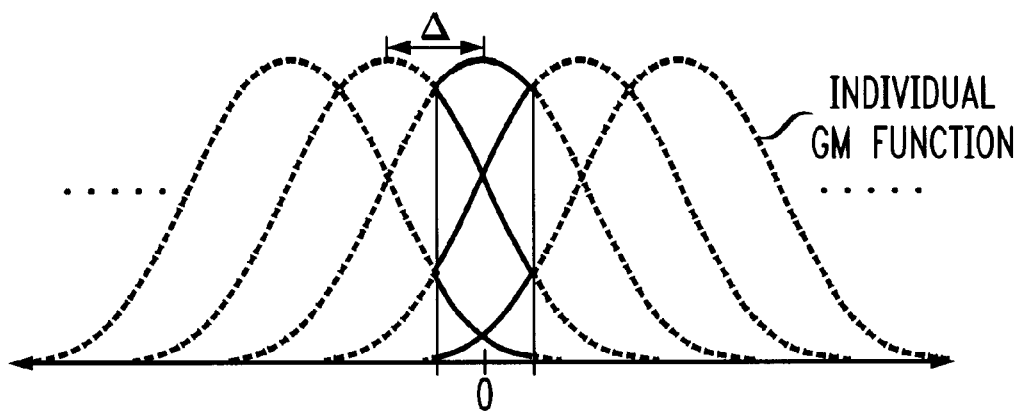
FIG. 5 illustrates the transconductance characteristic, $gm_{mdp}$, of a multiple differential pair circuit as a sum of identical $\Delta$-spaced $gm_{dp}$ functions.

First, consider a hypothetical multiple differential pair circuit 100 consisting of an infinite number of differential transistor pair circuits 200. FIG. 5 illustrates the transconductance, $gm_{mdp}$, of a multiple differential pair circuit 100 as a sum of identical $\Delta$-spaced $gm_{dp}$ functions. As shown in FIG. 5, the transconductance function, $g_m$, of such a circuit is the sum of the infinitely many identical $\Delta$-spaced $gm_{dp}$ functions. In other words, $$gm_{mdp}(V_{in}) = \sum_{k=-\infty}^{\infty} gm_{dp}(V_{in} + k\Delta) \quad \text{Eq. 3}$$

The transconductance, $g_m$, is clearly an even periodic function of $V_{in}$ (with a period of $\Delta$). Thus, the transconductance, $g_m$, can be written in the form:

$$gm_{mdp}(V_{in}) = \sum_{k=0}^{\infty} a_k \cos\left(2\pi k \frac{V_{in}}{\Delta}\right) = a_0[1 + R(V_{in})] \quad \text{Eq. 4}$$

where all $a_k$ coefficients have dimensions A/V and $$R(V_{in}) \sum_{k=1}^{\infty} \frac{a_k}{a_0} \cos\left(2\pi k \frac{V_{in}}{\Delta}\right).$$

Thus, $a_0$ determines the average value of $gm_{mdp}$, while all higher-order coefficients ($a_k$, $k \geq 1$) determine its ripple.

The periodicity allows only the behavior of $gm_{mdp}$ to be considered only in the region $$\pm \frac{\Delta}{2}.$$

Figure 6:
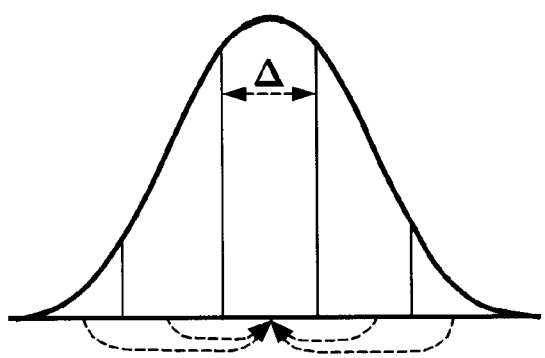
FIG. 6 illustrates the transconductance characteristic, $gm_{mdp}$, of a multiple differential pair circuit in a $\Delta$ region as a "sliced and overlaid" $gm_{dp}$ function.

FIG. 6 illustrates the transconductance, $gm_{mdp}$, of a multiple differential pair circuit 100 in a $\Delta$ region as a "sliced and overlaid" $gm_{dp}$ function. In other words, as shown in FIG. 6, the $gm_{mdp}$ in the region $$\pm \frac{\Delta}{2}$$

can be viewed as a result of slicing a single $gm_{dp}$ function into $\Delta$-pieces and overlaying them on top of each other. Thus, the area under the $gm_{mdp}$ in the region $$\pm \frac{\Delta}{2}$$

equals the total area under a single $gm_{dp}$ curve.

$$\int_{-\frac{\Delta V}{2}}^{\frac{\Delta V}{2}} gm_{mdp}(x)dx = \int_{-\infty}^{\infty} gm_{dp}(x)dx = I_0 \quad \text{Eq. 5}$$

Using equation 5, it can be shown that $a_0$ is given by:

$$a_0 = \frac{I_0}{\Delta} \quad \text{Eq. 6}$$

Thus, $a_0$ depends only on the biasing ($I_0$ and $\Delta$) and not on the voltage-current (V-I) characteristic of the utilized transistors. High linearity (small $R(V_{in})$) can be achieved by proper selection of the offset voltage, $\Delta$.

If it is assumed that the offset voltage, $\Delta$, is selected such that $$R_{max} = \frac{\Delta}{I_0}\left|\sum_{k=1}^{\infty} a_k\right|$$

is much smaller than 1, then the following is true:

$$gm_{mdp}(V_{in}) \approx a_0 \approx \frac{I_0}{\Delta}. \quad \text{Eq. 7}$$

Equation 7 shows that as a multiple differential pair circuit 100 is being linearized, the effective transconductance, $g_m$, becomes (i) linearly dependent on bias current, and (ii) insensitive to the voltage-current (V-I) characteristics of the utilized devices 210. In addition, equation 7 suggests that the transconductance, $g_m$, can be made nearly temperature, supply and process independent by making $I_0$ and $\Delta$ temperature, supply and process independent. This task can be accomplished in any technology using well-known bandgap-based bias techniques.

The transconductance, $g_m$, of a multiple differential pair circuit 100 employing a finite number of differential transistor pair circuits 200 has three different regions, namely, a middle region and two end regions. The middle region is the range of input voltages $V_{in}$ for which the following holds:

$$\int_{V_{in}-\frac{\Delta}{2}}^{V_{in}+\frac{\Delta}{2}} gm_{mdp}(x)dx = I_0 \qquad \text{Eq. 8}$$

Therefore, in the middle region, the operation and the properties of the finite-pair circuit 100 are identical to those of the infinite-pair circuit 100, discussed above. Depending on (i) the number of pairs used in the multiple differential pair circuit 100, (ii) the selected technology and (iii) the offset voltage, $\Delta$, the middle region may or may not exist.

The effect of having a finite number of transistor pairs 200 in the multiple differential pair circuit 100 is observed in the end regions. In the end regions, $$\int_{V_{in}-\frac{\Delta}{2}}^{V_{in}+\frac{\Delta}{2}} gm_{mdp}(x)dV_x < I_0 \qquad \text{Eq. 9}$$

and $gm_{mdp}$ has a value that is smaller than the nominal (and desired) $I_0/\Delta$. The end regions of a bipolar circuit do not change with $I_0$ while those of MOS circuits grow with $I_0$. This difference is the direct consequence of the fact that the spread of $gm_{dp}$ of a bipolar differential transistor pair circuit 200 does not change with $I_0$ while the spread of the $gm_{dp}$ of a MOS differential transistor pair circuit 200 increases with $I_0^2$.

Figure 7:
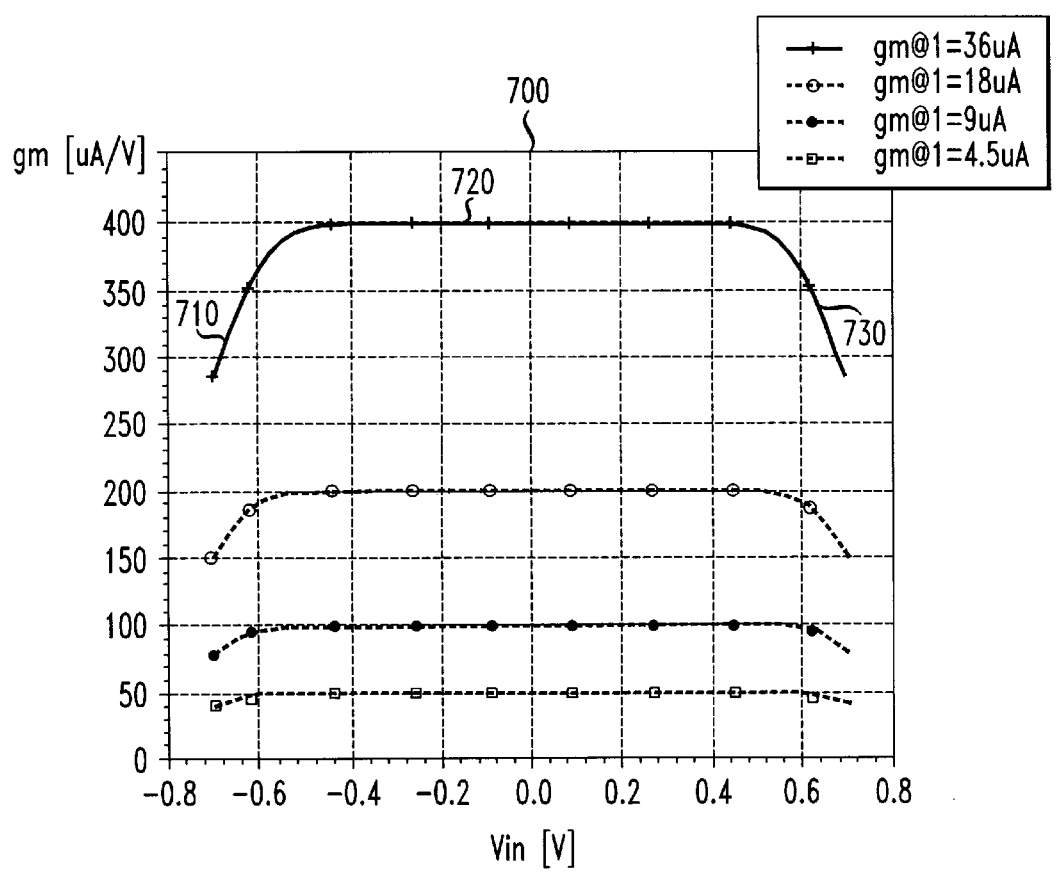
FIG. 7 illustrates the transconductance characteristic, $g_m$, of an equidistant-offset multiple differential pair circuit implemented in MOS technology, in accordance with the present invention.

FIG. 7 illustrates the transconductance characteristic, $g_m$, 700 of an equidistant-offset multiple differential pair circuit implemented in MOS technology. As shown in FIG. 7, the increase of the end regions, such as the end regions 710, 730, in MOS multiple differential pair circuits 100 causes a decrease of the available mid-region 720. Nevertheless, multiple differential pair circuit 100 implemented in MOS technology, can provide reasonable input linear range and a decade of linear-with-current tuning.

It is to be understood that the embodiments and variations shown and described herein are merely illustrative of the principles of this invention and that various modifications may be implemented by those skilled in the art without departing from the scope and spirit of the invention.

I claim:

1. A multiple differential pair circuit having a transconductance, $g_m$, that varies linearly with a bias current, $I_0$, said circuit comprising a plurality of differential transistor pair circuits coupled in parallel, wherein said differential transistor pair circuits are comprised of transistors operating in a non-exponential voltage-current (V-I) region.

2. The multiple differential pair circuit of claim 1, wherein said transistors are MOS transistors.

3. The multiple differential pair circuit of claim 1, wherein the control terminals of each of said differential transistor pair circuits are coupled to one another.

4. The multiple differential pair circuit of claim 1, wherein the output terminals of each of said differential transistor pair circuits are coupled to one another.

5. The multiple differential pair circuit of claim 1, wherein the transconductance, $g_m$, is constant as an applied voltage, $V_{in}$, is varied.

6. The multiple differential pair circuit of claim 1, wherein the transconductance, $g_m$, varies linearly as said bias current, $I_0$, is varied.

7. A method of linearly varying the transconductance, $g_m$, of a multiple differential pair circuit with respect to an bias current, $I_0$, said method comprising the steps of:

coupling a plurality of differential transistor pair circuits in parallel, wherein said differential transistor pair circuits are comprised of transistors operating in a non-exponential voltage-current (V-I) region; and varying the transconductance, $g_m$, of said multiple differential pair circuit by applying said bias current, $I_0$, to each of said differential pairs.

8. The method of claim 5, wherein said transistors are MOS transistors.

9. The method of claim 5, further comprising the step of coupling the control terminals of each of said differential transistor pair circuits to one another.

10. The method of claim 5, further comprising the step of coupling the output terminals of each of said differential transistor pair circuits to one another.

11. A multiple differential pair circuit having a transconductance, $g_m$, that varies linearly with a bias current, $I_0$, comprising:

a plurality of differential transistor pair circuits coupled in parallel, wherein said differential transistor pair circuits are comprised of transistors operating in a non-exponential voltage-current (V-I) region;

at least one voltage source for applying an offset voltage, $\Delta$, to each of said differential pairs; and at least one current source for applying said bias current, $I_0$, to each of said differential pairs.

12. A gain control circuit comprised of:

at least one multiple differential pair circuit having a transconductance, $g_m$, that varies linearly with a bias current, $I_0$, said circuit comprising a plurality of differential transistor pair circuits coupled in parallel, wherein said differential transistor pair circuits are comprised of transistors operating in a non-exponential voltage-current (V-I) region.

13. An analog multiplier comprised of:

at least one multiple differential pair circuit having a transconductance, $g_m$, that varies linearly with a bias current, $I_0$, said circuit comprising a plurality of differential transistor pair circuits coupled in parallel, wherein said differential transistor pair circuits are comprised of transistors operating in a non-exponential voltage-current (V-I) region.

14. A filter comprised of:

at least one multiple differential pair circuit having a transconductance, $g_m$, that varies linearly with a bias current, $I_0$, said circuit comprising a plurality of differential transistor pair circuits coupled in parallel, wherein said differential transistor pair circuits are comprised of transistors operating in a non-exponential voltage-current (V-I) region.

* * * * *